(12) United States Patent
Yoshida et al.

(10) Patent No.: US 11,415,712 B2
(45) Date of Patent: Aug. 16, 2022

(54) RADIATION DETECTOR, METHOD AND APPARATUS OF MANUFACTURING THE SAME, SCINTILLATOR PANEL AND METHOD AND APPARATUS OF MANUFACTURING THE SAME

(71) Applicant: CANON ELECTRON TUBES & DEVICES CO., LTD., Otawara (JP)

(72) Inventors: Atsuya Yoshida, Utsunomiya (JP); Hiroshi Horiuchi, Otawara (JP)

(73) Assignee: CANON ELECTRON TUBES & DEVICES CO., LTD., Otawara (JP)

( * ) Notice: Subject to any disclaimer, the term of this patent is extended or adjusted under 35 U.S.C. 154(b) by 0 days.

(21) Appl. No.: 17/191,865

(22) Filed: Mar. 4, 2021

(65) Prior Publication Data

US 2021/0190976 A1  Jun. 24, 2021

Related U.S. Application Data

(63) Continuation of application No. PCT/JP2019/033398, filed on Aug. 26, 2019.

(30) Foreign Application Priority Data

Sep. 4, 2018  (JP) .............................. JP2018-165281

(51) Int. Cl.
*G01T 1/20* (2006.01)
*G01T 1/202* (2006.01)

(52) U.S. Cl.
CPC ........ *G01T 1/20185* (2020.05); *G01T 1/2002* (2013.01); *G01T 1/2023* (2013.01)

(58) Field of Classification Search
CPC .. G01T 1/20185; G01T 1/2002; G01T 1/2023
See application file for complete search history.

(56) References Cited

U.S. PATENT DOCUMENTS

| 4,820,926 A | 4/1989 | Popma et al. |
| 2008/0083877 A1 | 4/2008 | Nomura et al. |

(Continued)

FOREIGN PATENT DOCUMENTS

| CN | 87 1 02131 A | 9/1987 |
| EP | 0 240 053 A1 | 10/1987 |

(Continued)

OTHER PUBLICATIONS

International Search Report dated Nov. 12, 2019 in PCT/JP2019/033398 filed on Aug. 26, 2019, 2 pages.

(Continued)

*Primary Examiner* — Hugh Maupin
(74) *Attorney, Agent, or Firm* — Oblon, McClelland, Maier & Neustadt, L.L.P.

(57) ABSTRACT

According to one embodiment, a radiation detector includes a photo-electric conversion substrate, a scintillator layer containing a main material and a dope material and a light reflective layer or a moisture barrier layer, formed on a front surface side of the scintillator layer along a shape of the front surface of the scintillator layer. The scintillator layer includes a mixed layer portion formed of the main material the dope material on the photo-electric conversion substrate, and a dope material layer portion formed of only the dope material on a front surface side of the mixed layer portion. A front surface of at least the dope material layer portion is formed into relatively coarse shape compared to the mixed layer portion.

6 Claims, 5 Drawing Sheets

(56) References Cited

U.S. PATENT DOCUMENTS

| | | | |
|---|---|---|---|
| 2009/0200479 | A1 | 8/2009 | Nomura et al. |
| 2012/0097855 | A1 | 4/2012 | Kasai et al. |
| 2016/0035870 | A1 | 2/2016 | Wu et al. |
| 2018/0011209 | A1* | 1/2018 | Yoshida ................ C30B 25/025 |

FOREIGN PATENT DOCUMENTS

| | | | |
|---|---|---|---|
| JP | 62-235600 | A | 10/1987 |
| JP | 2007-114134 | A | 5/2007 |
| JP | 2008-051793 | A | 3/2008 |
| JP | 2009-084471 | A | 4/2009 |
| JP | 6306334 | B2 | 4/2018 |
| NL | 8600696 | A | 10/1987 |
| TW | 201214464 | A | 4/2012 |
| TW | 201508309 | A | 3/2015 |
| TW | I518352 | B | 1/2016 |
| TW | 201611037 | A | 3/2016 |
| WO | WO 99/66346 | A1 | 12/1999 |
| WO | WO 2010/150576 | A1 | 12/2010 |

OTHER PUBLICATIONS

Taiwanese Office Action dated Apr. 20, 2020 in Taiwanese Patent Application No. 108131362, 11 pages (with English Machine Translation).

* cited by examiner

RADIATION DETECTOR, METHOD AND APPARATUS OF MANUFACTURING THE SAME, SCINTILLATOR PANEL AND METHOD AND APPARATUS OF MANUFACTURING THE SAME

CROSS-REFERENCE TO RELATED APPLICATIONS

This application is a Continuation Application of PCT Application No. PCT/JP2019/033398, filed Aug. 26, 2019 and based upon and claiming the benefit of priority from Japanese Patent Application No. 2018-165281, filed Sep. 4, 2018, the entire contents of all of which are incorporated herein by reference.

FIELD

Embodiments described herein relate generally to a radiation detector which detects radiation, a method and apparatus for manufacturing the radiation detector, and a scintillator panel, a method and apparatus for manufacturing the scintillator panel.

BACKGROUND

Radiation detectors and scintillator panels comprise a scintillator layer. The scintillator layer is formed, for example, of thallium-activated cesium iodide (CsI/Tl). In order to form a scintillator layer, it is effective to employ a dual vapor deposition method using cesium iodide (CsI) as a main material and thallium iodide (TlI) as a doping material. Note that thallium (Tl) is doped in a form of iodide as thallium iodide (TlI), to make the anionic element common.

It is known that the characteristics of scintillator layers, which include improvement of modulation transfer function (MTF) characteristics, suppression of desensitization by radiation and improvement of ghost characteristics, can be adjusted by regulating Tl concentration (TlI concentration).

Further, on a front surface side of a scintillator layer, a reflective layer or a moisture barrier layer is formed along a front surface shape of the scintillator layer. The reflective layer reflects fluorescence converted by the scintillator layer when radiation is made incident thereon to, for example, a direction of a photo-electric conversion substrate. The moisture barrier layer protects the scintillator layer from steam and the like contained in the air. Here, in order to inhibit detachment of the reflective layer or the moisture barrier layer from the scintillator layer, it is preferable that the adhesion between the scintillator layer and the reflective layer or the moisture barrier layer should be as high as possible.

DETAILED DESCRIPTION

Figure 1:
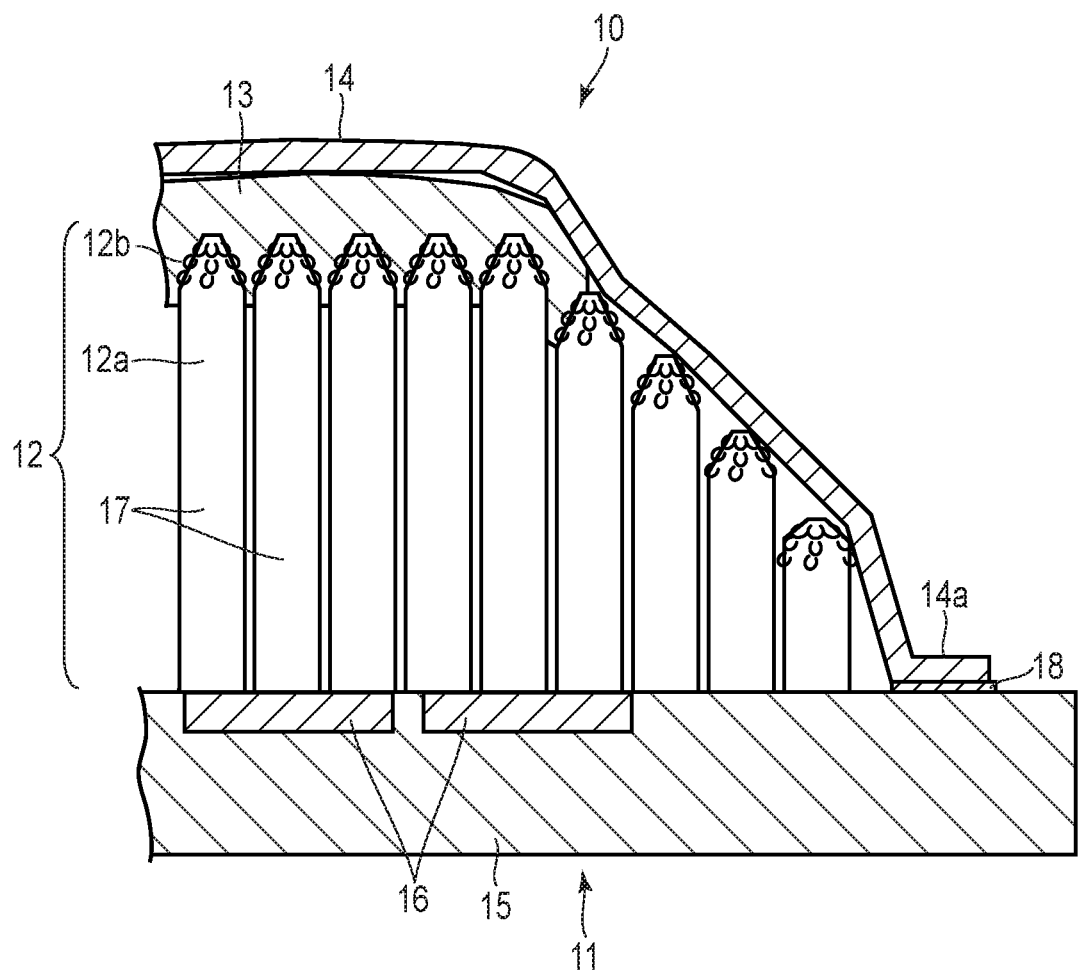
FIG. 1 is a cross-sectional view of a radiation detector of the first embodiment.

Embodiments will be described hereinafter with reference to the accompanying drawings.

In general, according to one embodiment, there is provided a radiation detector comprising a photo-electric conversion substrate, a scintillator layer containing a main material and a dope material and formed on the photo-electric conversion substrate by a vacuum deposition method and a reflective layer or a moisture barrier layer, formed on a front surface side of the scintillator layer along a front surface shape of the scintillator layer. The scintillator layer includes a mixed layer portion formed of the main material and the dope material on the photo-electric conversion substrate, and a dope material layer portion formed of only the dope material on a front surface side of the mixed layer portion. A surface of at least the dope material layer portion is formed into relatively coarse shape compared to the mixed layer portion.

According to another embodiment, there is provided a method of manufacturing a radiation detector, wherein a photo-electric conversion substrate and a first evaporation source storing a main material are placed to oppose each other, and the photo-electric conversion substrate and a second evaporation source storing a dope material are placed to oppose each other in a vacuum, and a scintillator layer is formed on the photo-electric conversion substrate by a vacuum deposition method, in which the first evaporation source and the second evaporation source are heated by a first heating portion and a second heating portion, respectively, the method comprising:

measuring a temperature of the first evaporation source;

controlling electric power to be supplied to the first heating portion based on the measured temperature of the first evaporation source;

judging whether a relationship: $P(\tau 1) > K \cdot P(\tau 2)$ is shifted to a relationship: $P(\tau 1) \leq K \cdot P(\tau 2)$ where $P(\tau 1)$ represents a short-time moving average of electric power to be supplied to the first heating portion in a latest short time $\tau 1$, $P(\tau 2)$ represents a long-time moving average of the electric power in a latest long time $\tau 2$, which is longer than the latest short time $\tau 1$, and K is a coefficient ($0 < K \leq 1$); and stopping deposition from the second evaporation source when it is determined that the relationship is shifted to $P(\tau 1) \leq K \cdot P(\tau 2)$.

According to still another embodiment, there is provided an apparatus of a manufacturing a radiation detector, wherein a photo-electric conversion substrate and a first evaporation source storing a main material are placed to oppose each other, and the photo-electric conversion substrate and a second evaporation source storing a dope material are placed to oppose each other in a vacuum, and a scintillator layer is formed on the photo-electric conversion substrate by a vacuum deposition method, in which the first evaporation source and the second evaporation source are heated by a first heating portion and a second heating portion, respectively, the apparatus comprising:

a thermometry portion which measures a temperature of the first evaporation source;

an electric power control portion that controls electric power to be supplied to the first heating portion based on the measured temperature of the first evaporation source;

a deposition end judgement portion which judges whether a relationship: $P(\tau 1) > K \cdot P(\tau 2)$ is shifted to a relationship: $P(\tau 1) \leq K \cdot P(\tau 2)$ where $P(\tau 1)$ represents a short-time moving average of electric power to be supplied to the first heating portion in a latest short time $\tau 1$, $P(\tau 2)$ represents a long-time moving average of the electric power in a latest long time τ2, which is longer than the latest short time τ1, and K is a coefficient (0<K≤1); and a deposition stopping control portion which stops deposition from the second evaporation source when it is determined that the relationship is shifted to P(τ1)≤K·P(τ2).

According to still another embodiment, there is provided a scintillator panel comprising a substrate which transmits radiation, a scintillator layer containing a main material and a dope material and formed on the substrate by a vacuum deposition method and a moisture barrier layer formed on a front surface side of the scintillator layer along a front surface shape of the scintillator layer. The scintillator layer includes a mixed layer portion formed of the main material and the dope material on the substrate, and a dope material layer portion formed of only the dope material on a front surface side of the mixed layer portion. A front surface of at least the dope material layer portion is formed into relatively coarse shape compared to the mixed layer portion.

According to still another embodiment, there is provided a method of manufacturing a scintillator panel, wherein a substrate transmitting radiation and a first evaporation source storing a main material are placed to oppose each other, and the substrate and a second evaporation source storing a dope material are placed to oppose each other in a vacuum, and a scintillator layer is formed on the substrate by a vacuum deposition method, in which the first evaporation source and the second evaporation source are heated by a first heating portion and a second heating portion, respectively, the method comprising:

measuring a temperature of the first evaporation source;

controlling electric power to be supplied to the first heating portion based on the measured temperature of the first evaporation source;

judging whether a relationship: P(τ1)>K·P(τ2) is shifted to a relationship: P(τ1)≤K·P(τ2) where P(τ1) represents a short-time moving average of electric power to be supplied to the first heating portion in a latest short time τ1, P(τ2) represents a long-time moving average of the electric power in a latest long time τ2, which is longer than the latest short time τ1, and K is a coefficient (0<K≤1); and stopping deposition from the second evaporation source when it is determined that the relationship is shifted to P(τ1)≤K·P(τ1).

According to still another embodiment, there is provided an apparatus of manufacturing a scintillator panel, wherein a substrate transmitting radiation and a first evaporation source storing a main material are placed to oppose each other, and the substrate and a second evaporation source storing a dope material are placed to oppose each other in a vacuum, and a scintillator layer is formed on the substrate by a vacuum deposition method, in which the first evaporation source and the second evaporation source are heated by a first heating portion and a second heating portion, respectively, the apparatus comprising:

a thermometry portion which measures a temperature of the first evaporation source;

an electric power control portion that controls electric power to be supplied to the first heating portion based on the measured temperature of the first evaporation source;

a deposition end judgement portion which judges whether a relationship: P(τ1)>K·P(τ2) is shifted to a relationship: P(τ1)≤K·P(τ2) where P(τ1) represents a short-time moving average of electric power to be supplied to the first heating portion in a latest short time τ1, P(τ2) represents a long-time moving average of the electric power in a latest long time τ2, which is longer than the latest short time τ1, and K is a coefficient (0<K≤1); and a deposition stopping control portion which stops deposition from the second evaporation source when it is determined that the relationship is shifted to P(τ1)≤K·P(τ2).

The first embodiment will be described with reference to FIGS. 1 to 4. FIG. 1 is a cross-sectional view of a radiation detector 10 of the first embodiment.

As shown in FIG. 1, the radiation detector 10 is an X-ray flat panel detector which detects radiographic images, which are radiation images. The radiation detector 10 can be used for, for example, general medical practice applications. Note that the application of the radiation detector 10 is not limited to the general medical practice.

The radiation detector 10 comprises a photo-electric conversion substrate 11, a scintillator layer 12 formed on the photo-electric conversion substrate 11, a light reflective layer 13 formed on the scintillator layer 12 and a moisture barrier member 14 that covers the scintillator layer 12 and the light reflective layer 13.

The photo-electric conversion substrate 11 comprises a substrate 15 and a plurality of pixels formed in a matrix form on the substrate 15. Each of the pixels includes a photoelectric converting element 16 such as a photodiode and a thin film transistor. The photoelectric converting element 16 converts fluorescence entering from the scintillator layer 12 into an electric signal and outputs the signal via the thin film transistor to outside.

The scintillator layer 12 is formed of thallium-activated cesium iodide (CsI/Tl). The scintillator layer 12 is formed by a vacuum deposition method as it is deposited into a columnar shape, and it contains cesium iodide (CsI) as a main ingredient material and thallium iodide (TlI) as a dope material. That is, the scintillator layer 12 includes a columnar crystal structure in which a plurality of strip-shaped columnar crystals 17 are arranged along a surface direction of the photo-electric conversion substrate 11. The scintillator layer 12 converts radiation entering from a moisture barrier member 14 side into fluorescence.

The scintillator layer 12 includes a mixed layer portion 12a formed of the main material of cesium iodide and the dope material of thallium iodide, on the photo-electric conversion substrate 11, and a dope material layer portion 12b formed of a dope material of thallium iodide only on a front surface side of the mixed layer portion 12a. The front surface of the mixed layer portion 12a has a smooth state as it is formed as the main material of cesium iodide and the dope material of thallium iodide are mixed together, whereas the front surface of the dope material layer portion 12b has a state on which minute projections and recesses are created by crystal grains of the dope material of thallium iodide. In other words, the front surface of the dope material layer portion 12b is formed to be coarse with an irregular shape as compared to the front surface of the mixed layer portion 12a.

The light reflective layer 13 is formed on a front surface side of the scintillator layer 12 along a shape of the front surface of thereof. In other words, the light reflective layer 13 is attached on the front surface of the dope material layer portion 12b of the scintillator layer 12. The reflective layer 13 reflects fluorescence converted by the scintillator layer 12 towards the photo-electric conversion substrate 11.

The moisture barrier member 14 is provided to inhibit deterioration in characteristics of the scintillator layer 12 and the light reflective layer 13, which may be caused by moisture contained in the air. The moisture barrier member 14 has a hat shape and is formed of, for example, an aluminum alloy. A brim portion 14a, which is a periphery of the moisture barrier member 14, is joined to the photo-electric conversion substrate 11 via a joint layer 18.

Figure 2:
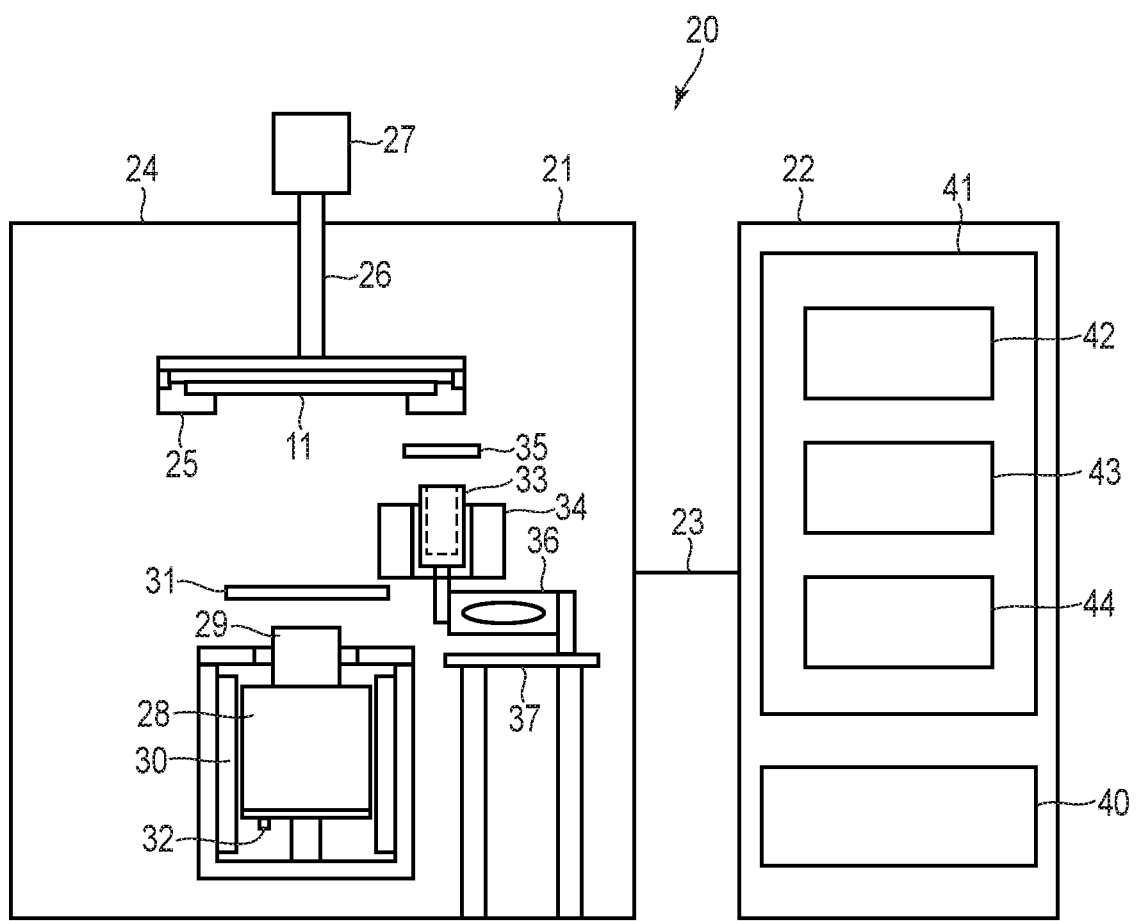
FIG. 2 is a configuration diagram of an apparatus for manufacturing of the radiation detector.

Next, FIG. 2 is a configuration diagram showing a structure of an apparatus 20 for manufacturing the scintillator layer 12 of the radiation detector 10.

As shown in FIG. 2, the manufacturing apparatus 20 comprises a deposition device 21 and a control device 22. The deposition device 21 and the control device 22 are connected by various types of cables 23 for power source and signals.

The deposition device 21 includes a vacuum chamber 24. The photo-electric conversion substrate 11 is disposed on an upper side in the vacuum chamber 24 while it is fitted to the deposition mask 25. The deposition mask 25 is connected to a rotation shaft 26. The rotation shaft 26 is coupled to a motor 27 for rotating the substrate, installed in the atmosphere through a rotation introduction flange (not shown) provided in the vacuum chamber 24. Note that the deposition device 21 comprises a substrate heating portion (not shown) which heats the photo-electric conversion substrate 11 fitted to the deposition mask 25.

A first evaporation source 28, which is a first crucible to store the main material, is disposed in a lower portion side in the vacuum chamber 24 so as to oppose the photo-electric conversion substrate 11. In the first evaporation source 28, a chimney 29 which ejects steam of the main material, is disposed so as to face the photo-electric conversion substrate 11. Around the first evaporation source 28, a first heating portion 30 such as a heater which heats the first evaporation source 28, is disposed. Above the first evaporation source 28, a first shutter 31, which controls whether or not the steam of the main material reaches the photo-electric conversion substrate 11, is disposed so as to be openable or closable. Further, a thermometry portion (a first thermometry portion) 32, which measures the temperature of the first evaporation source 28 is disposed on the first evaporation source 28.

Between the first evaporation source 28 and the photo-electric conversion substrate 11 in the vacuum chamber 24, a second evaporation source 33, which is a second crucible which stores the dope material, is disposed so as to oppose the photo-electric conversion substrate 11. The second evaporation source 33 as well is of such a structure that the steam of the dope material is ejected from an upper portion. Around the second evaporation source 33, a second heating portion 34, which is a heater which heats the second evaporation source 33, is disposed. Above the second evaporation source 33, a second shutter 35, which controls whether or not the steam of the dope material reaches the photo-electric conversion substrate 11, is disposed so as to be openable and closable.

The second evaporation source 33 is attached to a distortion gauge 36 to measure the mass of the second evaporation source 33. The distortion gauge 36 is made from an aluminum block and, on FIG. 2, is provided with a function of detecting distortion of the block, which may be caused by forces applied perpendicularly downward and perpendicularly upward to a left edge and a right edge thereof, and outputting as a voltage signal. In this embodiment, the entire mass of the second evaporation source 33 is applied to the left edge of the distortion gauge 36, and the right edge is fixed to an inside of the vacuum chamber 24 via a table 37. Consequently, the amount of distortion of the distortion gauge 36 is varied according to the mass of the second evaporation source 33. Further, in the second evaporation source 33, a second thermometry portion (not shown) which measures the temperature of the second evaporation source 33 is disposed.

The control device 22 comprises a mass measurement portion 40, which is a mass meter which measures the mass of the second evaporation source 33, a control portion 41 which controls the manufacturing process by the manufacturing apparatus 20 and the like. Note that the control device 22 may comprise a power supply unit (not shown) which supplies drive electric power to the motor for rotating the substrate and supplies electric power to each of the heating portions 30 and 34.

To the mass measurement portion 40, a voltage signal from the distortion gauge 36 according to the mass of the second evaporation source 33 is input, and then converted into mass data. The mass measurement portion 40 measures the mass of the second evaporation source 33 and transfers the value of the mass to the control portion 41 as a BCD signal in real time.

The control portion 41 takes in signals relating to the drive of the deposition device 21, which may involve the temperature of each of the evaporation sources 28 and 33 (including the temperature data from the thermometry portion 32), a current and voltage of each of the heating portions 30 and 34, the temperature of the photo-electric conversion substrate 11, the open/close state of each of the shutters 31 and 35, the pressure inside the vacuum chamber 24, the open/close state of each of the other valves, etc. from the members other than the mass measurement portion 40. Further, the control portion 41 outputs control orders such as turning ON/OFF of each of the heating portions 30 and 34 and the electric power when the portion is ON, turning ON/OFF of the substrate heating portion of the photo-electric conversion substrate 11 and the electric power when the portion is ON, open/close of each of the shutters 31 and 35, open/close of each of the valves, to each of the units of the deposition device 21.

The control portion 41 stores a program which originates the control orders and it has various types of functions. The control portion 41 is provided for the following functions:

A function of a power control portion 42 which controls electric power to be supplied to the first heating portion 30 based on the temperature of the first evaporation source 28 measured with the thermometry portion 32;

A function of a deposition end judging portion 43 which judges the end of deposition, which can be achieved by detecting the shift from the relationship: $P(\tau1) > K \cdot P(\tau2)$ to the relationship: $P(\tau1) \leq K \cdot P(\tau2)$ where $P(\tau1)$ represents a short-time moving average of electric power to be supplied to the first heating portion 30 in a latest short time $\tau1$, $P(\tau2)$ represents a long-time moving average of the electric power in a latest long time $\tau2$, which is longer than the latest short time $\tau1$, and K is a coefficient ($0 < K \leq 1$).

A function of a deposition stopping control portion 44 which stops deposition from the second evaporation source 33 when it is determined that the relationship has shifted to $P(\tau1) \leq K \cdot P(\tau2)$.

Next, the process of forming the scintillator layer 12 will be described.

For performing double-deposition of a main material and a dope material, the designing of the deposition end process is important. More specifically, it is necessary to appropriately control the timing for stopping the supply of the main material and dope material to the photo-electric conversion substrate 11.

One of the effective measures for ending deposition is a method, which is so-called "evaporation-up" by which the evaporation of all materials is completed in one process. This method uses all materials which are measured in advance and loaded in the respective evaporation sources 28 and 33 for evaporation, and therefore it is effective to improve reproducibility of the thickness of the scintillator layer 12 attached to the photo-electric conversion substrate 11. In this case, when all the materials vanish, the deposition ends. But note that both of the main material and dope material cannot be subjected to the evaporation-up method. This is because, it is difficult to set the time difference between evaporating up the main material and evaporating up the dope material stored in the respective evaporation sources 28 and 33 as so designed for each batch. Therefore, such a method is realistic, that one is evaporated up and the other is controlled by opening/closing the shutter.

Let us suppose here that the main material is subjected to the evaporation-up method. In this case, it considered that different drawbacks arise respectively for the cases where the timing of the end of the deposition of the dope materials is excessively early with relative to the timing of the end of deposition of the main material, these timings are simultaneous, and the timing is excessively late.

First, if the timing is excessively early, a time zone in which only the main material is deposited is created. In this period, a dope material deficient layer is formed on an outermost surface of the scintillator layer 12. The presence of the dope material deficient layer may cause desensitization of the scintillator layer 12 and enhancement of the sensitivity ghost.

When the timings are simultaneous, there arises no particular problem in terms of characteristics, but the outermost surface of each columnar crystal 17 has a smooth shape. In this case, no particular problem is created if nothing is formed on the columnar crystals 17 which constitutes the scintillator layer 12. But if a light reflective layer 13 or the like is formed, such a problem as film detachment may easily occur. This is also the case when the timing is excessively early as described above.

When the timing is excessively late, a layer with a great amount of dope material is formed on the surface of the scintillator layer 12, so as to absorb the emission created by the scintillator layer 12, and thus the sensitivity of the scintillator layer 12 is degraded.

In the film formation process of this embodiment, the thickness of the dope material layer portion 12b is appropriately set.

Figure 3:
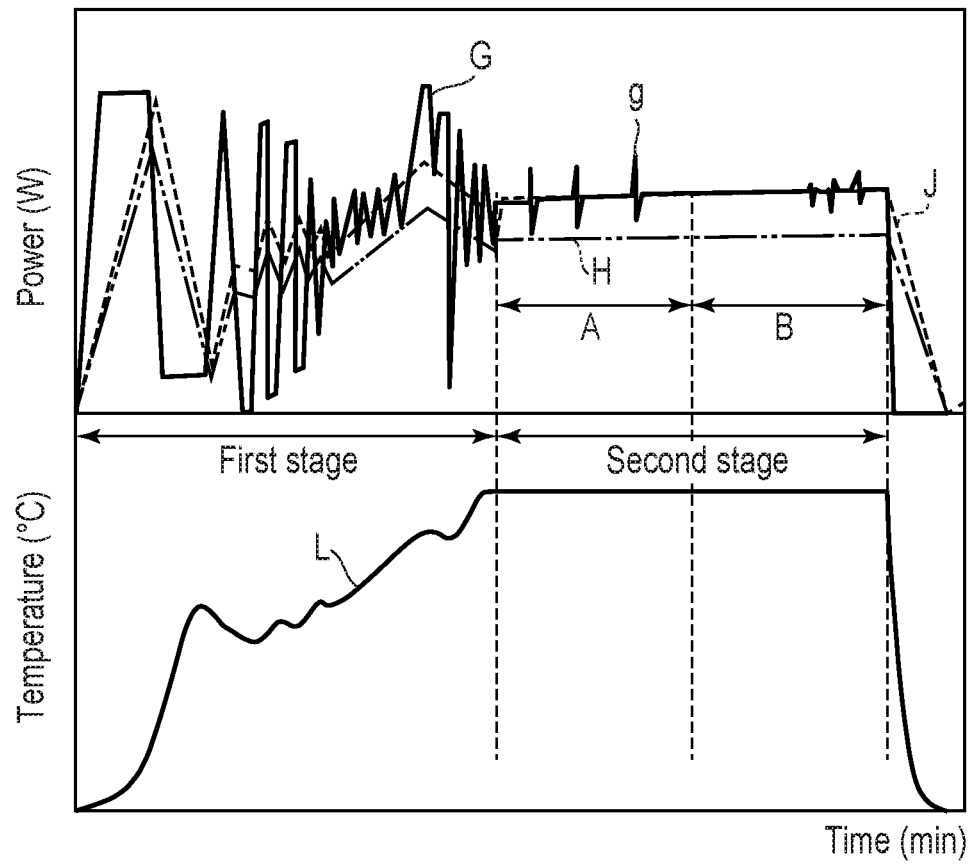
FIG. 3 is a graph showing change in electric power and temperature of the manufacturing apparatus along with time.
Figure 4:
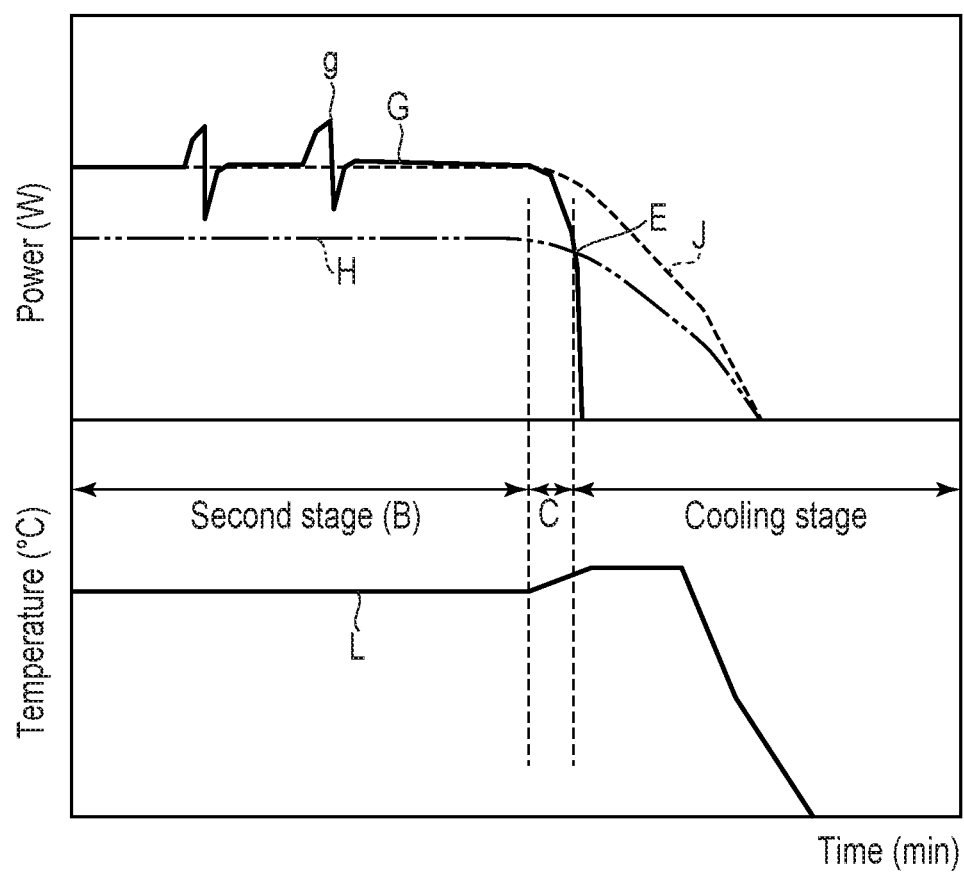
FIG. 4 is a graph showing change in electric power and temperature of the manufacturing apparatus along with time.

In this embodiment, the heating state of the first evaporation source 28 as well is described with reference to FIGS. 3 and 4. Upper parts of FIGS. 3 and 4 are each a graph illustrating a change in electric power applied to the first heating portion 30 for the first evaporation source 28 along with time. A polygonal line G represents a value of the short time moving average when the latest (most recent) short time is one minute ($\tau 1=1$ min), a polygonal line J represents a value of the long time moving average when the latest (most recent) long time is thirty minutes ($\tau 2=30$ min), and a polygonal line H represents a value obtained by multiplying a curve J with a coefficient $K=0.85$. These values are calculated in real time with the progression of the deposition process so as to be usable anytime for the judgment of the end of the deposition, which will be discussed later. Further, lower parts of FIGS. 3 and 4 are each a graph illustrating a change in temperature of the first evaporation source 28 along with time.

As shown in FIGS. 2 to 4, the main material is stored in the first evaporation source 28, and the dope material is stored in the second evaporation source 33. Then, the photo-electric conversion substrate 11 is attached to the deposition mask 25, and the deposition mask 25 is attached to the rotation shaft 26.

In this state, the vacuum chamber 24 is closed, and the pressure inside the vacuum chamber 24 is reduced to $10^{-3}$ Pa with a vacuum pump (not shown). When the decompression is finished, the first stage of the deposition process in FIG. 4 is started. In the first stage, each of the members in the vacuum chamber 24 are preheated.

First, the photo-electric conversion substrate 11 is heated with a substrate heating portion (not shown) while rotating the photo-electric conversion substrate 11 with the motor 27 for rotating the substrate. At the same time, electric power is applied to the first heating portion 30 and the second heating portion 34 to so start the heating of the first evaporation source 28 and the second evaporation source 33. A temperature control method is used in heating of the first evaporation source 28. That is, the first stage controls the temperature of the first evaporation source 28 to rise at a constant rate, for example, from ordinary temperature to 700° C. for 120 minutes. At this time, as shown in FIG. 3, the polygonal line G of the short time moving average tremendously moves up and down. Note that the temperature of the second evaporation source 33 is controlled similarly though omitted in FIGS. 3 and 4.

Subsequently, in the second stage of the deposition process, when the temperatures of the first evaporation source 28 and second evaporation source 33 reach predetermined temperatures of, for example, 700° C. and 410° C., respectively, the temperatures are maintained constant. Then, at the same time, the shutters 31 and 35 are opened, and steam of the main material and steam of the dope material are jetted out from the respective evaporation sources 28 and 33 towards the photo-electric conversion substrate 11, thus starting the deposition of the mixed layer 12a of the main material and the dope material, which constitutes the scintillator layer 12 on the photo-electric conversion substrate 11.

During the second stage, the temperature of the first evaporation source 28 is stable to be constant at 700° C., and thus there is no particular fluctuation factor in the vacuum chamber 24. Therefore, the electric power to be supplied to the first heating portion 30 is substantially constant at a certain value (for example, 4,200 W). However, ripples g can be sometimes observed, which are created in response to slight ups-and-downs of the temperature. If the value of the polygonal line G of the short time moving average becomes less than the value of the polygonal line H even instantaneously due to a ripple g or the like, it is judged to be the end of the deposition there by software, which may cause malfunction of the deposition device. In order to avoid this, the value of K is set to an appropriate value of 1 or less, by which the polygonal line G never becomes less than the polygonal line H did even if a ripple g occurs. K was set to, for example, 0.85 here.

Alternatively, the second stage may be divided into two or more steps, zone A and zone B in FIG. 3, and the zone A is provided for a time period in which relatively large ripples g are still observed and the main material of the first evaporation source 28 cannot be possibly considered to dry up from experience. Then, it can be programmed that in this zone, it is not judged to be the end of deposition even if a ripple g is less than the polygonal line H.

In the second stage or the zone B of the second stage, when the entire amount of the main material stored in the first evaporation source 28 evaporates and the main material in the first evaporation source 28 dries up, the portion of the electric power used so far for heating, which is consumed by the latent heat of vaporization of the main material remains in the first evaporation source 28. Therefore, as shown in zone C of FIG. 4, the temperature of the first evaporation source 28 (curve L) slightly increases.

When the temperature of the first evaporation source 28 originally maintained constant at a set value of 700° C. increases, the electric power to be supplied to the first heating portion 30 suddenly decreases so as to set the temperature back to the original value. When the electric power to be supplied to the first heating portion 30 suddenly decreases, the value of the curve G of the short time moving average also decreases quickly to follow. On the other hand, the value of the polygonal line J of the long time moving average does not decrease that much suddenly. As a result, the value of polygonal line G of the short time moving average becomes less than the value of the polygonal line H at a point E in FIG. 4.

At this time, the deposition end judging portion 43 of the control portion 41 is monitoring whether the relationship: $P(\tau 1) > K \cdot P(\tau 2)$ is shifted to the relationship: $P(\tau 1) \leq K \cdot P(\tau 2)$ where $P(\tau 1)$ represents a short-time moving average of electric power to be supplied to the first heating portion 30 in a latest short time $\tau 1$, $P(\tau 2)$ represents a long-time moving average of the electric power in a latest long time $\tau 2$, which is longer than the latest short time $\tau 1$, and K is a coefficient ($0 < K \leq 1$). Thus, the deposition end judgement portion 43 judges that the relationship: $P(\tau 1) > K \cdot P(\tau 2)$ has been shifted to the relationship: $P(\tau 1) \leq K \cdot P(\tau 2)$ at the point E in FIG. 4, that is, the end of the deposition.

The deposition stopping control portion 44 of the control portion 41 stops deposition from the second evaporation source 33 when it is judged that the relationship has been shifted to $P(\tau 1) \leq K \cdot P(\tau 2)$. To stop the deposition, the second shutter 35 is closed so that the steam of the dope material does not reach the photo-electric conversion substrate 11. Further, the control portion 41 stops the supply of the electric power to each of the heating portions 30 and 34 of the deposition device 21, to terminate entire heating in a cooling zone.

During the zone C, the main material dries up and only the dope material is deposited, thus forming a dope material layer portion 12b on a front surface side of the mixed layer portion 12a of the scintillator layer 12. Therefore, the time of the zone C is proportional to the thickness of the dope material layer portion 12b. The length of the zone C varies along the size of the coefficient K to be multiplied with the long time moving average and an average time $\tau 1$ of the short time moving average. The zone C becomes longer as K is smaller or $\tau 1$ is larger. Therefore, by increasing or decreasing these values, the thickness of the dope material layer portion 12b can be appropriately adjusted. In this embodiment, by setting $\tau 1 = 1$ minute and K=0.85, the thickness of the dope material layer portion 12b is controlled to about 0.1 to 0.3 μm and the front surface of the dope material layer portion 12b is formed into relatively coarse shape compared to the front surface of the mixed layer portion 12a as shown in FIG. 1. It was found that if the film thickness is increased further than this, the dope material layer portion 12b became a photo-absorption layer, causing the degradation in characteristics.

Note that the effect to improve the adhesive power of the reflective layer 13 is low if the spatial cycle of the projections and recesses on the front surface of the dope material layer portion 12b is sufficiently less than the spatial cycle of the projections and recesses on the front surface side of the scintillator layer 12, that is, the special cycle between the projections and recesses made by the distal portions of the columnar crystals 17. Therefore, it is preferable that the spatial cycle of the projections and recesses on the front surface of the dope material layer portion 12b should be ⅕ or less of the spatial cycle of the projections and recesses on the front surface side of the scintillator layer 12, that is, the special cycle between the projections and recesses made by the distal portions of the columnar crystals 17. For example, when the diameter of the columnar crystals 17 of the scintillator layer 12 is 10 μm, the spatial cycle of the projections and recesses on the dope material layer portion 12b is 2 μm or less, and thus the effect can be obtained that the adhesive power of the light reflective layer 13 formed on the front surface side of the dope material layer portion 12b is improved.

When the second stage is finished, the process proceeds to a cooling stage. When the cooling is finished, argon gas is introduced into the vacuum chamber 24. Then, when the pressure restores the atmospheric pressure, the photo-electric conversion substrate 11 is unloaded.

The photo-electric conversion substrate 11, which has been subjected to the vacuum deposition process, is coated with the light reflective layer 13 formed on the front surface side of the scintillator layer 12. Then, the moisture barrier member 14 is disposed to wrap up the scintillator layer 12 and the light reflective layer 13, and the brim portion 14a of the moisture barrier member 14 and the photo-electric conversion substrate 11 are joined together by the joint layer 18 so as to be integrated with the photo-electric conversion substrate 11 as one body.

Thus, the radiation detector 10 which comprises the photo-electric conversion substrate 11 as its substrate is completed.

As discussed above, in the radiation detector 10, the scintillator layer 12 includes the mixed layer portion 12a formed of the main material and the dope material and the dope material layer portion 12b formed only of the dope material on the front surface side of the mixed layer portion 12a. The front surface of the mixed layer portion 12a has a smooth shape as the main material and the dope material are mingled with each other, whereas the front surface of the dope material layer portion 12b is formed to have a shape on which minute projections and recesses are created by crystal grains of the dope material. In other words, the front surface of the dope material layer portion 12b is formed into relatively coarse shape compared to the front surface of the mixed layer portion 12a. With this configuration, the reflective layer 13 formed on the front surface side of the scintillator layer 12 is formed on the front surface of the dope material layer portion 12b, thereby making it possible to improve the adhesive power to the scintillator layer 12 and inhibit the detachment of the film.

Further, the method of manufacturing the radiation detector 10 and the manufacturing apparatus 20 involve a temperature measuring step for measuring the temperature of the first evaporation source 28, an electric power control step for controlling the electric power to be supplied to the first heating portion 30 based on the temperature of the first evaporation source 28 measured with the thermometry portion 32, a deposition end judgment step for judging whether the relationship: $P(\tau 1) > K \cdot P(\tau 2)$ is shifted to the relationship: $P(\tau 1) \leq K \cdot P(\tau 2)$ where $P(\tau 1)$ represents a short-time moving average of electric power to be supplied to the first heating portion 30 in a latest short time $\tau 1$, $P(\tau 2)$ represents a long-time moving average of the electric power in a latest long time $\tau 2$, which is longer than the latest short time $\tau 1$, and K is a coefficient ($0 < K \leq 1$), that is, the end of the deposition, and a deposition stopping control step of stopping deposition from the second evaporation source 33 when it is judged that the relationship is shifted to $P(\tau 1) \leq K \cdot P(\tau 2)$. In this manner, the scintillator layer 12 can be formed, which includes the mixed layer portion 12a formed of the main material and the dope material, and the dope material layer portion 12b formed of only the dope material on the front surface side of the mixed layer portion 12a. The light reflective layer 13 is formed on the front surface side of the thus formed scintillator layer 12. With this configuration, the light reflective layer 13 is formed on the front surface of the dope material layer portion 12b, thereby making it possible to improve the adhesive power to the scintillator layer 12 and secure the adherence with the scintillator layer 12.

With the improved adhesive power between the scintillator layer 12 and the light reflective layer 13, there is no need to interpose an adhesive member between the scintillator layer 12 and the light reflective layer 13. Thus, the cost can be cut down, the scattering of light caused by the adhesive member can be avoided, thus contributing to the improvement of resolution characteristics.

Note that, on the front surface side of the scintillator layer 12, a moisture barrier layer, in place of the light reflective layer 13, may be formed along a shape of the front surface of the scintillator layer 12. With such a moisture barrier layer provided, the moisture barrier layer is formed on the front surface of the dope material layer portion 12b, thus improving the adhesive power to the scintillator layer 12 and securing the adherence with the scintillator layer 12.

Figure 5:
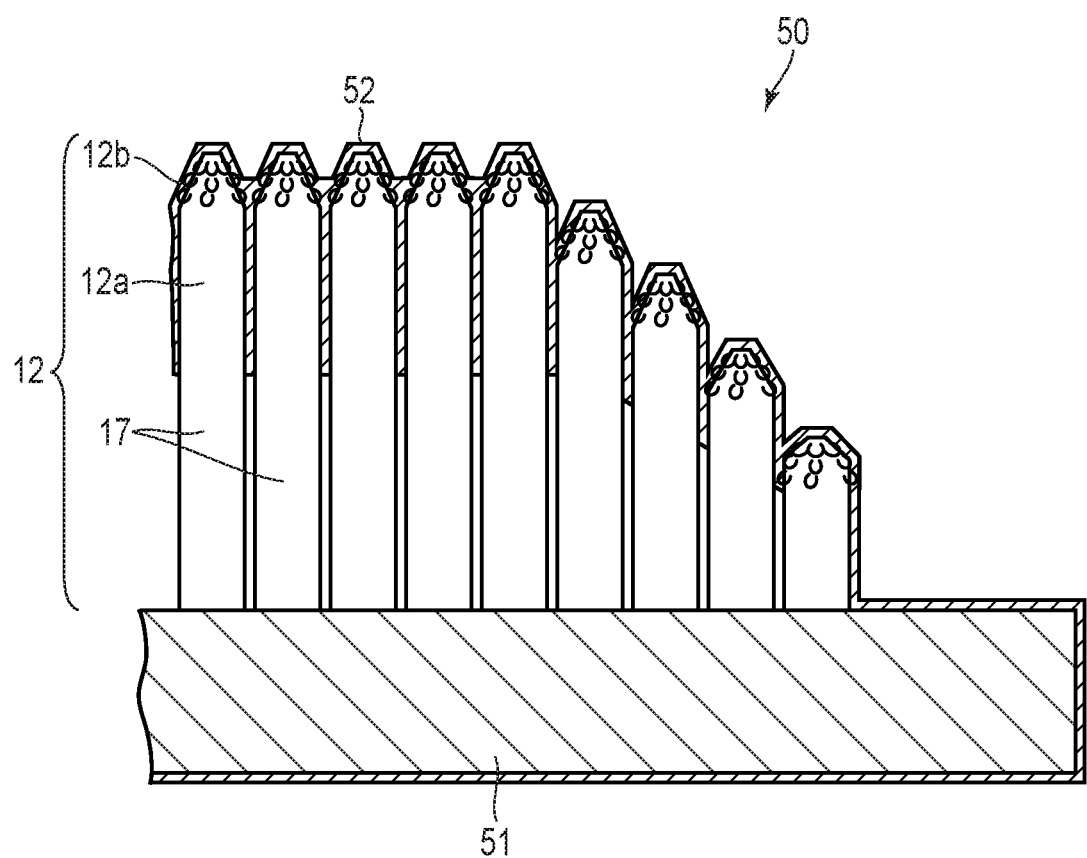
FIG. 5 is a cross-sectional view of a scintillator panel of the second embodiment.

FIG. 5 shows the second embodiment.

As shown in FIG. 5, the structure, the manufacturing method and the manufacturing apparatus 20 of the scintillator layer 12 of the first embodiment are also applicable to a scintillator panel 50 and a manufacturing method and a manufacturing apparatus of the scintillator panel 50.

The scintillator panel 50 comprises a substrate 51 which transmits radiation, a scintillator layer 12 formed on the substrate 51, a moisture barrier layer 52 which covers the scintillator layer 12, and the like. As in the case of the first embodiment, the scintillator layer 12 includes a mixed layer portion 12a and a dope material layer portion 12b.

The moisture barrier layer 52 is formed, for example, by a chemical vapor deposition (CVD) method using polyparaxylylene.

Then, as shown in FIGS. 2 and 5, the substrate 51 is fitted to a deposition mask 25, and then loaded in a vacuum chamber 24. Here, by the vacuum deposition method mentioned above, the scintillator layer 12 is formed on the substrate 51.

The scintillator panel 50 thus formed is incorporated with, for example, a photo-electric conversion substrate on a front surface side (an opposite side to the substrate 51) of the moisture barrier layer 52, and constituted as a radiation detector. The scintillator panel 50 converts radiation entering from the substrate 51 side into fluorescence by the scintillator layer 12.

With the scintillator panel 50 and the manufacturing method and the manufacturing apparatus 20 of the scintillator panel 50 described above, an advantageous operational effect similar to that of the first embodiment can be also obtained.

Note that the material of the scintillator layer 12 of each of the embodiments may be any one of, for example, thallium-activated cesium iodide (CsI/Tl), europium-activated cesium bromide (CsBr/Eu), sodium-activated cesium iodide (CsI/Na), thallium-activated sodium iodide (NaI/Tl) and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radiation detector comprising:
   a photo-electric conversion substrate;
   a scintillator layer containing a main material and a dope material and formed on the photo-electric conversion substrate by a vacuum deposition method; and
   a reflective layer or a moisture barrier layer, formed on a front surface side of the scintillator layer along a front surface shape of the scintillator layer,
   wherein
   the scintillator layer includes a mixed layer portion formed of the main material and the dope material on the photo-electric conversion substrate, and a dope material layer portion formed of only the dope material on a front surface side of the mixed layer portion, and
   a front surface of at least the dope material layer portion is formed into relatively coarse shape compared to the mixed layer portion.

2. A method of manufacturing a radiation detector, wherein a photo-electric conversion substrate and a first evaporation source storing a main material are placed to oppose each other, and the photo-electric conversion substrate and a second evaporation source storing a dope material are placed to oppose each other in a vacuum, and a scintillator layer is formed on the photo-electric conversion substrate by a vacuum deposition method, in which the first evaporation source and the second evaporation source are heated by a first heating portion and a second heating portion, respectively, the method comprising:
   measuring a temperature of the first evaporation source;
   controlling electric power to be supplied to the first heating portion based on the measured temperature of the first evaporation source;
   judging whether a relationship: $P(\tau 1) > K \cdot P(\tau 2)$ is shifted to a relationship: $P(\tau 1) \leq K \cdot P(\tau 2)$ where $P(\tau 1)$ represents a short-time moving average of electric power to be supplied to the first heating portion in a latest short time $\tau 1$, $P(\tau 2)$ represents a long-time moving average of the electric power in a latest long time $\tau 2$, which is longer than the latest short time $\tau 1$, and K is a coefficient ($0 < K \leq 1$); and
   stopping deposition from the second evaporation source when it is determined that the relationship is shifted to $P(\tau 1) \leq K \cdot P(\tau 2)$.

3. An apparatus of a manufacturing a radiation detector, wherein a photo-electric conversion substrate and a first evaporation source storing a main material are placed to oppose each other, and the photo-electric conversion substrate and a second evaporation source storing a dope material are placed to oppose each other in a vacuum, and a scintillator layer is formed on the photo-electric conversion substrate by a vacuum deposition method, in which the first evaporation source and the second evaporation source are heated by a first heating portion and a second heating portion, respectively, the apparatus comprising:

a thermometry portion which measures a temperature of the first evaporation source;
an electric power control portion that controls electric power to be supplied to the first heating portion based on the measured temperature of the first evaporation source;
a deposition end judgement portion which judges whether a relationship: $P(\tau 1) > K \cdot P(\tau 2)$ is shifted to a relationship: $P(\tau 1) \leq K \cdot P(\tau 2)$ where $P(\tau 1)$ represents a short-time moving average of electric power to be supplied to the first heating portion in a latest short time $\tau 1$, $P(\tau 2)$ represents a long-time moving average of the electric power in a latest long time $\tau 2$, which is longer than the latest short time $\tau 1$, and K is a coefficient ($0 < K \leq 1$); and
a deposition stopping control portion which stops deposition from the second evaporation source when it is determined that the relationship is shifted to $P(\tau 1) \leq K \cdot P(\tau 2)$.

4. A scintillator panel comprising:
a substrate which transmits radiation;
a scintillator layer containing a main material and a dope material and formed on the substrate by a vacuum deposition method; and
a moisture barrier layer formed on a front surface side of the scintillator layer along a front surface shape of the scintillator layer,
wherein
the scintillator layer includes a mixed layer portion formed of the main material and the dope material on the substrate, and a dope material layer portion formed of only the dope material on a front surface side of the mixed layer portion, and
a front surface of at least the dope material layer portion is formed into relatively coarse shape compared to the mixed layer portion.

5. A method of manufacturing a scintillator panel, wherein a substrate transmitting radiation and a first evaporation source storing a main material are placed to oppose each other, and the substrate and a second evaporation source storing a dope material are placed to oppose each other in a vacuum, and a scintillator layer is formed on the substrate by a vacuum deposition method, in which the first evaporation source and the second evaporation source are heated by a first heating portion and a second heating portion, respectively, the method comprising:
measuring a temperature of the first evaporation source;
controlling electric power to be supplied to the first heating portion based on the measured temperature of the first evaporation source;
judging whether a relationship: $P(\tau 1) > K \cdot P(\tau 2)$ is shifted to a relationship: $P(\tau 1) \leq K \cdot P(\tau 2)$ where $P(\tau 1)$ represents a short-time moving average of electric power to be supplied to the first heating portion in a latest short time $\tau 1$, $P(\tau 2)$ represents a long-time moving average of the electric power in a latest long time $\tau 2$, which is longer than the latest short time $\tau 1$, and K is a coefficient ($0 < K \leq 1$); and
stopping deposition from the second evaporation source when it is determined that the relationship is shifted to $P(\tau 1) \leq K \cdot P(\tau 2)$.

6. An apparatus of manufacturing a scintillator panel, wherein a substrate transmitting radiation and a first evaporation source storing a main material are placed to oppose each other, and the substrate and a second evaporation source storing a dope material are placed to oppose each other in a vacuum, and a scintillator layer is formed on the substrate by a vacuum deposition method, in which the first evaporation source and the second evaporation source are heated by a first heating portion and a second heating portion, respectively, the apparatus comprising:
a thermometry portion which measures a temperature of the first evaporation source;
an electric power control portion that controls electric power to be supplied to the first heating portion based on the measured temperature of the first evaporation source;
a deposition end judgement portion which judges whether a relationship: $P(\tau 1) > K \cdot P(\tau 2)$ is shifted to a relationship: $P(\tau 1) \leq K \cdot P(\tau 2)$ where $P(\tau 1)$ represents a short-time moving average of electric power to be supplied to the first heating portion in a latest short time $\tau 1$, $P(\tau 2)$ represents a long-time moving average of the electric power in a latest long time $\tau 2$, which is longer than the latest short time $\tau 1$, and K is a coefficient ($0 < K \leq 1$); and
a deposition stopping control portion which stops deposition from the second evaporation source when it is determined that the relationship is shifted to $P(\tau 1) \leq K \cdot P(\tau 2)$.

* * * * *